United States Patent [19]

Masuda

[11] Patent Number: 4,673,866
[45] Date of Patent: Jun. 16, 1987

[54] CONSTANT VOLTAGE GENERATOR USING MEMORY TRANSISTORS

[75] Inventor: Shinji Masuda, Tokyo, Japan

[73] Assignee: NEC Corporation, Tokyo, Japan

[21] Appl. No.: 665,447

[22] Filed: Oct. 26, 1984

[30] Foreign Application Priority Data

Oct. 27, 1983 [JP] Japan .................. 58-201371

[51] Int. Cl.$^4$ .............................................. G05F 3/20
[52] U.S. Cl. .................... 323/313; 323/298; 323/354; 323/369
[58] Field of Search ............ 323/298, 313, 314, 352, 323/353, 354, 364, 369

[56] References Cited

U.S. PATENT DOCUMENTS 4,377,781 3/1983 Tatsushi et al. ............... 323/313
4,414,501 11/1983 Bedard et al. ................. 323/354

Primary Examiner—Patrick R. Salce
Assistant Examiner—Anita M. Ault
Attorney, Agent, or Firm—Burns, Doane, Swecker & Mathis

[57] ABSTRACT

A constant voltage generator includes a resistance adjustable resistor having a series connection of a main resistor and sub-resistors, a circuit cooperating with the series connection to produce a constant voltage, a plural number of transistors having a collector-emitter path connected to corresponding one of the sub-resistors, and a plural number of semiconductor memories applying voltages to bases of the transistors, respectively, in accordance with stored information, whereby the resistance of the resistance adjustable resistor is adjusted by the stored information to control the output constant voltage.

9 Claims, 5 Drawing Figures and more particularly to a reference voltage generator applicable to circuits such as an analog-digital converter or a digital-analog converter formed in a semiconductor integrated circuit.

CONSTANT VOLTAGE GENERATOR USING MEMORY TRANSISTORS

BACKGROUND OF THE INVENTION

1. Field of the Invention

This invention relates to a constant voltage generator producing a precisely controlled value of voltage, and more particularly to a reference voltage generator applicable to circuits such as an analog-digital converter or a digital-analog converter formed in a semiconductor integrated circuit.

2. Description of the Prior Art

The analog-digital converter and a digital-analog converter use a reference voltage to convert signal form. Those analog-digital converters and digital-analog converters are nowadays manufactured in a form of semiconductor integrated circuit and the required reference voltage generators are also constructed in the semiconductor integrated circuit. Generally, the output reference voltage is determined by resistance of resistor in the reference voltage generator. The resistance of resistor formed in the semiconductor integrated circuit, however, has a large deviation due to uncertainty of manufacturing process. To compensate such deviation, the resistors used in the reference voltage generator is made so that the resistances may be adjusted. The typical example of such adjustable resistor has a series connection of a main resistor and a plural number of small resistors. The total resistance is controlled by the number of small resistors. Excessive small resistors are short-circuitted.

One example of such adjustable resistors in the prior art uses polycrystalline fuses as a means for shortcircuitting. The respective polycrystalline fuses are connected in parallel with corresponding small resistors to shortcircuit them. While the total resistance of the series resistors or the output reference voltage is measured, selected number of fuses are burn out by applying a high voltage. Another example uses wiring metals in place of the polycrystalline fuses. The wiring metals are melted away by exposing to LASER light.

According to those prior arts, melted polycrystalline silicon or wiring metals is spread out to damage the wirings and elements in the semiconductor integrated circuit. Further, when the fuses or wiring metals are melted, a high melting temperature causes a thermal stress to the neighboring circuit elements. The extreme case is a deterioration of electrical characteristics of circuit elements. Furthermore, in a case where the melting of fuses or wiring metals is insufficient, the separated parts of fuses or wiring metals reconnects in the long run. Finally, the polycrystalline silicon fuses are melted by applying a very high voltage. Therefore, the high voltage affects the neighboring circuit elements to deteriorate their electrical characteristics.

As mentioned above, the use of fuses or wiring metals lowers the reliability and the production yield.

SUMMARY OF THE INVENTION

It is a primary object of the present invention to provide a constant voltage generator with an output voltage controlled by adjusting a resistance value of a resistor, in which the resistance value can be adjusted without damaging other circuit elements and wirings and which produces a highly reliable reference voltage.

The constant voltage generator of the present invention comprises a main resistor, a plural number of sub-resistors connected in series with the main resistor, a circuit for generating a constant voltage the value of which is determined by the total resistance of the series connection of the main resistor and the sub-resistors and is adjusted by the number of effective sub-resistors, a plural number of transistors connected respectively to the corresponding sub-resistors, the transistors controlling the number of effective sub-resistors by being controlled their conductivities, and a plural number of semiconductor memories applying controlling voltages to corresponding transistors, the stored information of the semiconductor memories being electrically changeable.

In accordance with the present invention, the total resistance of the series connection of the main resistor and the sub-resistors is adjusted by the stored information of the semiconductor memories. Therefore, unlike the above-explained prior arts, melted polycrystalline silicon or metal is not spread out, resulted in no damage of wirings and semiconductor elements around the adjusted sub-resistors. A very high voltage is not required to memorize the semiconductor memories. The wires and semiconductor elements around the adjusted sub-resistors are not affected by the high voltage. Therefore, the resistance adjustment can be made reliably.

Furthermore, the memorized information in the semiconductor memories do not change for a long time. If the memorized information deteriorates, such slight change of information does not affect the transistors connected with corresponding resistors. Therefore, a precisely adjusted constant voltage can be obtained for a long time.

BRIEF DESCRIPTION OF THE DRAWINGS

The above and further objects, features and advantages of the present invention will become more apparent from the following detailed description taken in conjunction with the accompanying drawings, wherein.

Figure 1:
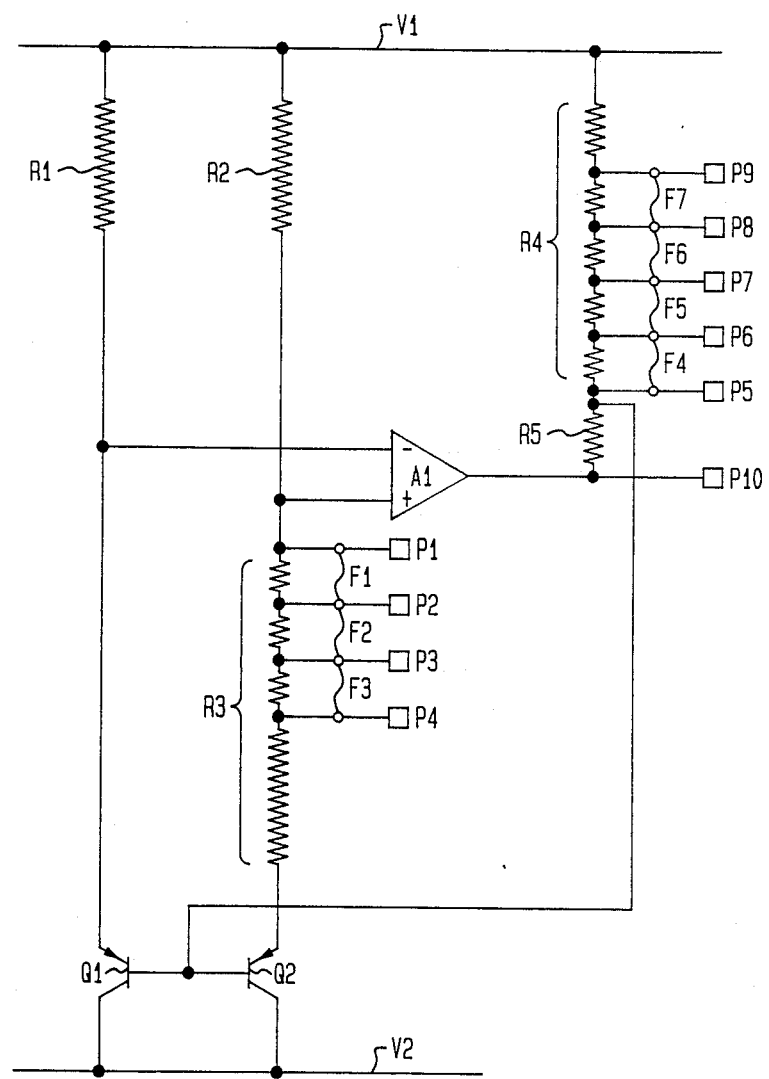
FIG. 1 is a circuit diagram of a reference voltage generator.

The circuit diagram shown in FIG. 1 is a band-gap type reference voltage generator formed in a semiconductor integrated circuit. Collectors of PNP transistors Q1 and Q2 are connected to a power supply line V2 which is grounded, for example. The bases of the PNP transistors Q1 and Q2 are commonly connected to the junction point of the resistors R4 and R5. The emitter of the PNP transistor Q1 is directly connected to an inverting input of a differential amplifier A1 and connected to another power supply line V1 through a resistor R1. The emitter of the PNP transistor Q2 is connected to the power supply line V1 through a series connection of resistors R2 and R3. The junction point of the resistors R2 and R3 is connected to a non-inverting input of the differential amplifier A1. The series connection of the resistors R4 and R5 is inserted between an output of the differential amplifier A1 and the power supply line V1. An output pad P10 is connected to the output of the differential amplifier A1 to derive a reference voltage.

The resistances of the resistors R3 and R4 is required to be adjusted to control the output reference voltage and its temperature coefficient, as explained later. The respective resistors R3 and R4 are series connections of main resistor and a plural number of sub-resistors. In parallel with the respective subresistors, fuses F1 to F7 made of polycrystalline silicon is connected. For applying high voltages to the fuses F1 to F7, electrode pads P1 to P9 are connected to sides of the fuses F1 to F7.

The output voltage $V_{OUT}$ obtained between the output pad P10 and the power supply line V1 can be expressed as follows:

$$V_{OUT} = \frac{R4 + R5}{R4}\left\{V_{BE1} + \frac{R2}{R3}\cdot\frac{hT}{q}\ln\left(n\frac{R2}{R1}\right)\right\} \quad (1)$$

where
$V_{BE1}$: a base-emitter forward biassed voltage of the transistor Q1 and
n: area ratio of emitters of the transistors Q1 and Q2.

As apparent from the equation (1), the output voltage and its temperature dependence can be controlled by the resistance of the resistor R4 and the resistance of the resistor R3, respectively.

The resistances of the resistors R3 and R4 are controlled by melting away selected number of fuses F1 to F7. The melting is performed by applying a high voltage between electrode pads at both sides of the fuse to be melted away.

The resistance control by way of melting fuses away lowers the reliability of the reference voltage generator formed in a semiconductor integrated circuit. First, the melted material of fuses spreads out and damages the wirings and/or circuit elements around the melted fuses. The temperature for melting the fuse applies a thermal stress to the circuit elements to alter their electrical characteristics. If the separation due to the melting is insufficient, the sub-resistor is short-circuitted again in the long run. Furthermore, the high voltage applied to melt fuses may destroy other circuit elements. Therefore, adjusted reference voltage generator is not reliable. If the adjustment is performed in the manufacturing process of the integrated circuit, the production yield of the reference voltage generator becomes low.

DESCRIPTION OF THE PREFERRED EMBODIMENTS

Figure 2:
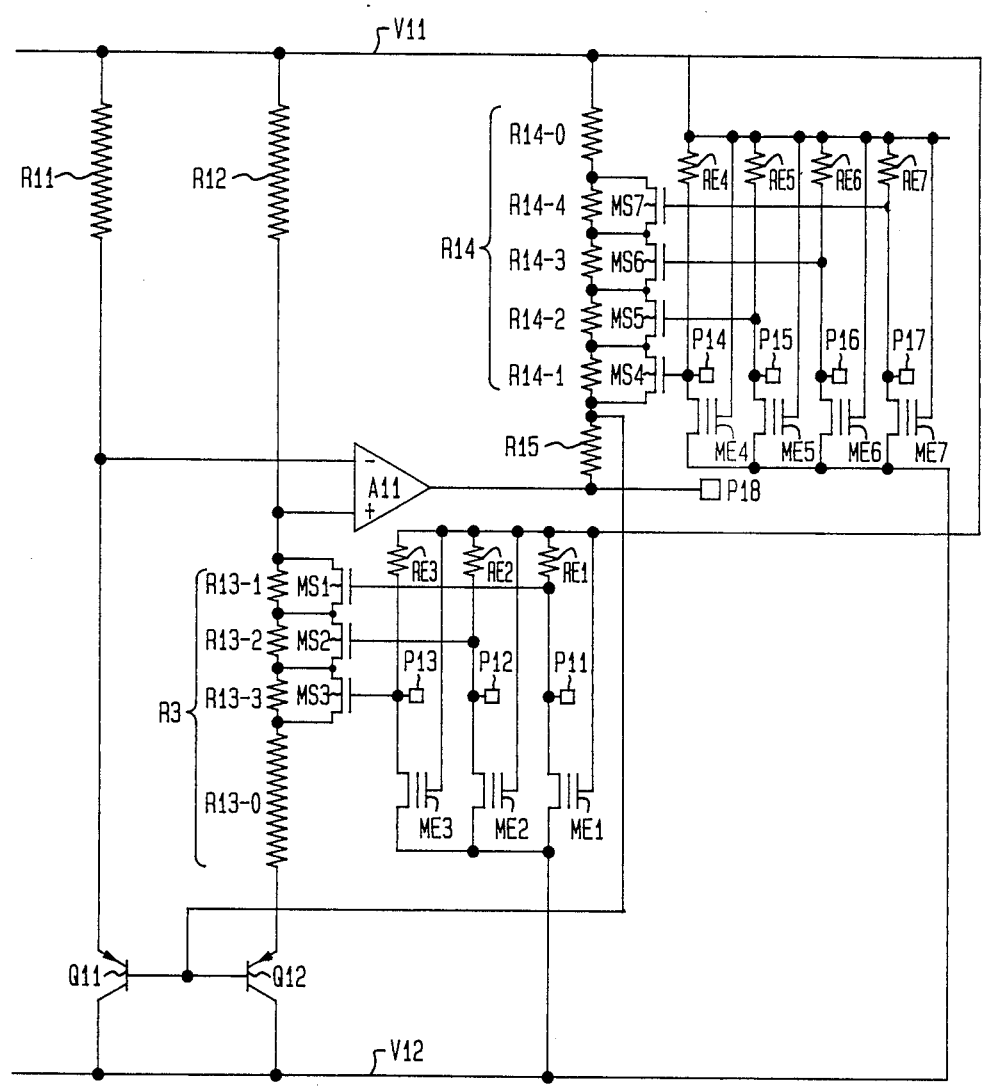
FIG. 2 is a circuit diagram of a reference voltage generator according to a first embodiment of the present invention.

A first embodiment of the present invention is shown in FIG. 2 in a form of circuit diagram which is constructed in a form of semiconductor integrated circuit. Resistors R11, R12 and R14 are connected to a power supply line V11. Examples of resistances are 3 kiloohms for the resistor R11 and 30 kiloohms for the resistor R12. The resistor R14 is a series connection of a main resistor R14-0 of 7 kiloohms, a first sub-resistor R14-1 of 1 kiloohm, a second sub-resistor R14-2 of 2-kiloohms, a third sub-resistor R14-3 and a fourth sub-resistor of 8 kiloohms, for example. Opposite end of the resistor R11 is connected with an inverting input of a differential amplifier A11 and an emitter of a PNP transistor Q11. Opposite end of the resistor R12 is directly connected with a non-inverting input of the differential amplifier A11 and to an emitter of a PNP transistor Q12 through a resistor R13. The resistor R13 is also a series connection of a main resistor R13-0 of 8 kiloohms, a first sub-resistor R13-1 of 1 kiloohm, a second sub-resistor R13-2 of 2 kiloohms and a third sub-resistor R13-3 of 4 kiloohms, for example. Collectors of the transistors Q11 and Q12 are commonly connected to the power supply line V12. One example of power voltage is 5 volts applied to the power supply line V11. The power supply line V12 is grounded in the example. Bases of the transistors Q11 and Q12 are connected together and to the opposite end of the resistor R14. A resistor R15 is inserted between the opposite end of the resistor R14 and the output of the differential amplifier A11. An output pad P18 is connected to the output of the differential amplifier A11 to produce an output reference voltage.

The above-explained structure is same as the reference voltage generator in the prior art. Therefore, the output reference voltage $V'_{OUT}$ can be calculated similarly to the equation (1) and expressed as follows:

$$V'_{OUT} = \frac{R14 + R15}{R14}\left\{V_{BE11} + \frac{R12}{R13}\cdot\frac{kT}{q}\ln\left(n\frac{R12}{R11}\right)\right\} \quad (2)$$

where
$V_{BE11}$ a base-emitter forward biased voltage of the transistor Q11
n area ratio of emitters of the transistors Q11 and Q12

Similar to the reference voltage generator in the prior art, the output reference voltage and its temperature coefficient may be controlled by resistances of the resistor R14 and the resistor R13, respectively. The structure for controlling the resistances of the resistors R13 and R14 will be explained hereinafter.

In parallel with the respective sub-resistors R13-1, R13-2 and R13-3, P-channel MOS field effect transistors MS1, MS2 and MS3 are connected. Similarly, other P-channel MOS field effect transistors MS4, MS5, MS6 and MS7 are respectively connected in parallel with the sub-resistors R14-1, R14-2, R14-3 and R14-4. Drains of PROM (Programmable Read-Only Memory) transistors ME1 to ME7 are respectively connected with gates of the MOS field effect transistors MS1 to MS7, resistors RE1 to RE7 and electrode pads P11 to P17. Sources of the PROM transistors ME1 to ME7 are connected with the power source line V12. An example of the PROM transistors ME1 to ME7 is an N-channel floating gate type, ultraviolet erasable and electrically programmable read-only memory. Other types of electrically programmable read-only memories may be used as the PROM transistors ME1 to ME7.

The programming to the PROM transistors ME1 to ME7 is achieved by applying 12 volts to the power supply line V11 and more than 8 volts to selective ones of the electrode pads P11 to P17. Unprogrammed PROM transistors have a threshold voltage of about 1 volt. Therefore, the unprogrammed PROM transistors are made conductive by the 5 volts at the power supply line V11. Therefore, the ground potential at the power supply line V12 is applied to the gates of the MOS transistors through the unprogrammed PROM transistors to short-circuit the sub-resistors with which the unprogrammed PROM transistors are connected in parallel. On the contrary, the threshold voltage of the programmed PROM transistors becomes higher than the voltage at the power supply line V11, that is 5 volts. The programmed PROM transistors remains non-conductive state. Therefore, the voltage at the power supply line V11 is applied to MOS transistors to keep them non-conductive. The sub-resistors with which the non-conductive MOS transistors are connected in parallel add their resistances to the main resistor to increase the total resistance. Thus, the resistances of the resistors R13 and R14 may be controlled.

The programming to the PROM transistors ME1 to ME7 will now be explained. First, the power supply line V12 is grounded, and 12 volts is applied to the other power supply line V11. More than 8 volts is applied to the selected electrode pads corresponding to the PROM transistors to be programmed, while the other electrode pads are grounded. Under this condition, electrons are injected to the floating gate of the PROM transistors to be programmed to make their threshold voltage higher than 5 volts.

Figure 3:
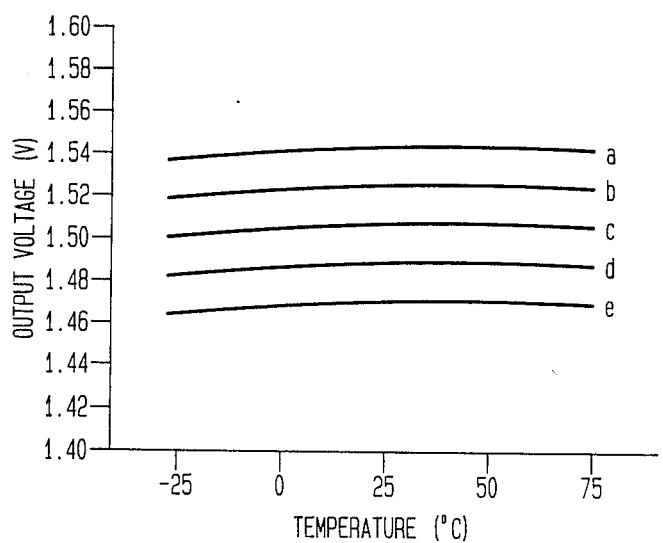
FIG. 3 is a graph showing output reference voltage controlled by semiconductor memories used in the first embodiment.

FIG. 3 shows the fact that the output reference voltage may be changed by the programming condition of the PROM transistors ME4 to ME7 when the PROM transistor ME1 and the PROM transistors ME2 and ME3 are programmed and unprogrammed, respectively. The curve a is a case where all the PROM transistors are unprogrammed. The voltage at the curve a is highest. The curve b is a case where the PROM transistor ME4 is programmed but the other PROM transistors ME5, ME6 and ME7 are not programmed. The curve c is a case where the PROM transistors ME4 and ME5 are programmed but the other PROM transistors ME6 and ME7 are not programmed. The curve d is a case where the PROM transistors ME4, ME5 and ME6 are programmed but the remaining PROM transistor ME7 is not programmed. The curve e is a case where all the PROM transistors ME4, ME5, ME6 and ME7 are programmed. The output voltage lowers in the order of curves a, b, c, d and e and is controllable by the programming condition of the PROM transistors ME4 to ME7.

Figure 4:
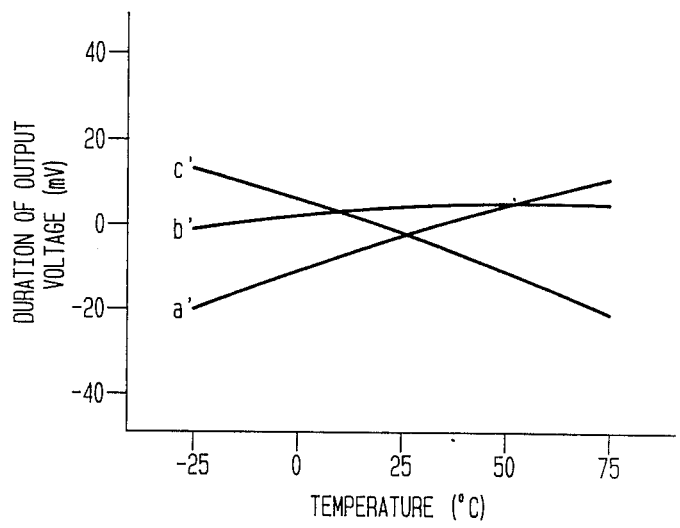
FIG. 4 is a graph showing temperature coefficients of output reference voltages controlled by other semiconductor memories used in the first embodiment.

FIG. 4 shows the fact that the temperature coefficient of the output reference voltage may be changed by the programming condition of the PROM transistors ME1 to ME3. The ordinate shows a voltage difference from voltage at $-25°$ C. of the curve c in FIG. 3. Therefore, the curve b' corresponds to the curve c in FIG. 3 and has a temperature coefficient of $+33$ ppm/$°$ C. The higher temperature coefficient can be obtained by all the PROM transistors ME1, ME2 and ME3 are not programmed. However, if all the PROM transistors ME1, ME2 and ME3 are not programmed, the output voltage is increased. Therefore, the output voltage is necessary to be compensated by programming the PROM transistors ME4, ME5 and ME6 (see, curve d in FIG. 3). Such case is shown in FIG. 4 by the curve a' which has a temperature coefficient of $+200$ ppm/$°$ C. On the contrary, the lower temperature coefficient can be obtained by increasing the number of programmed PROM transistors among the PROM transistors ME1 to ME3. The increase of the number of programmed PROM transistors decreases the output reference voltage. The decrease may be compensated by increasing the output voltage by way of decreasing the number of unprogrammed PROM transistors among the PROM transistors ME4 to ME7. One example is the curve c' in FIG. 4 which shows the case where the PROM transistors ME1, ME2, ME4 and ME5 are programmed. The curve c' has a temperature coefficient of $-250$ ppm/$°$ C.

As mentioned-above, the reference voltage generator according to the first embodiment of the present invention may precisely control the output reference voltage and its temperature coefficient by adjusting the resistances of the resistors R13 and R14. The adjustment of the resistances is not made by melting fuses or wiring metals, but by programming the PROM transistors ME1 to ME7. Therefore, melted material does not damage other wirings and circuit elements. The programming can be made by relatively low voltage, resulting in no damage to other circuit elements. Any high temperature is not required to program the PROM transistors ME1 to ME7. Therefore, any thermal stress is not applied to circuit element. The programmed condition is not deteriorated for a long time, resulted in producing an unchangeable reference voltage for a long time. Thus, the reference voltage adjustment can be made reliably.

Figure 5:
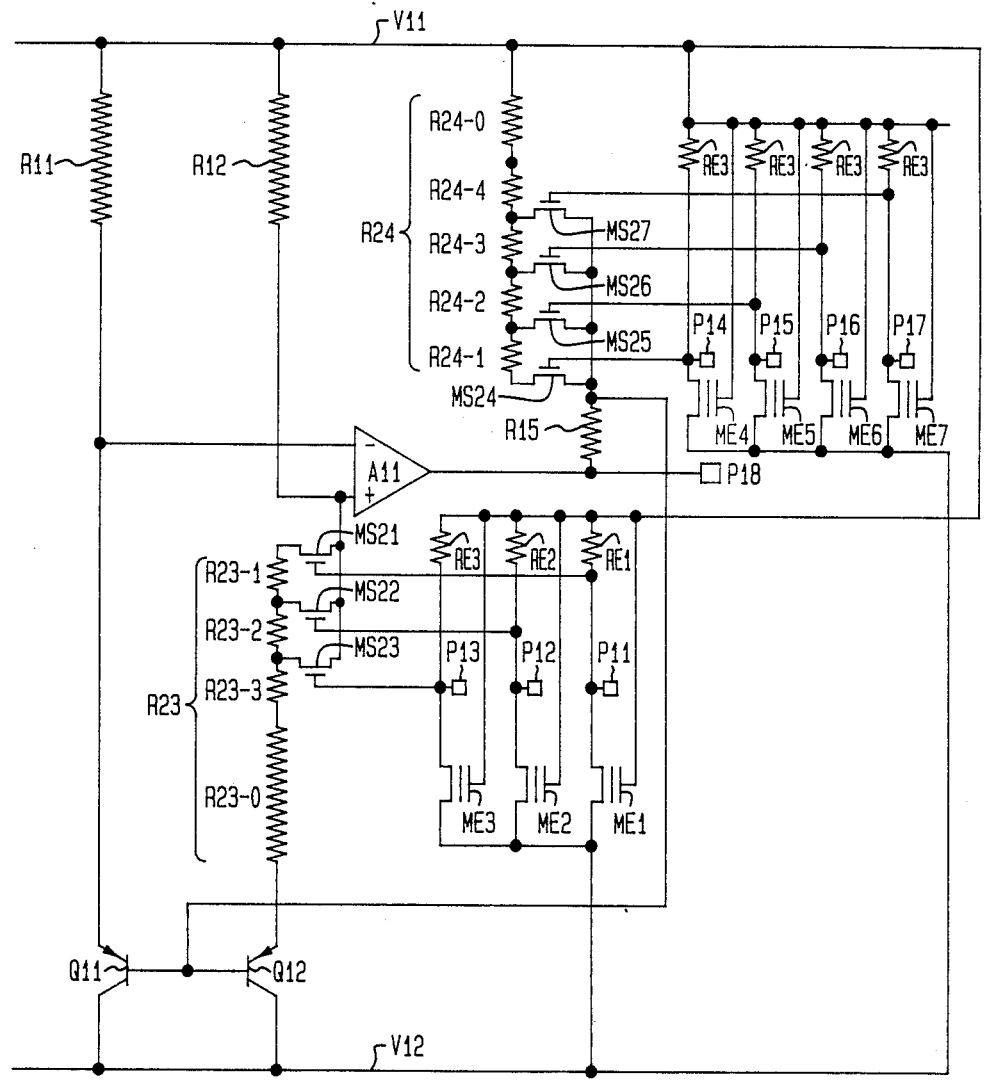
FIG. 5 is a circuit diagram of a reference voltage generator according to a second embodiment of the present invention.

FIG. 5 is a second embodiment of the reference voltage generator according to the present invention. The differences from the first embodiment are combinations of the resistor R23 and the MOS field effect transistors MS21 to MS23 and the resistor R24 and the MOS field effect transistors MS24 to MS27. The resistor R23 is a series connection of a main resistor R23-0 and sub-resistors R23-1, R23-2 and R23-3. The upper end of the sub-resistor R23-1 is connected to the non-inverting input of the differential amplifier A11 through a MOS field effect transistor MS21. The junction points between the sub-resistors R23-1 and R23-2 and the sub-resistors R13-2 and R23-3 are also connected to the non-inverting input through MOS field effect transistors MS22 and MS23, respectively. Similarly, the resistor R24 is a series connection of a main resistor R24-0 and sub-resistors R24-1, R24-2, R24-3 and R24-4. The lower ends of the sub-resistors R24-1, R24-2, R24-3 and R24-4 are connected to the resistor R15 through MOS field effect transistors MS24, MS25, MS26 and MS27, respectively.

To control the resistance of the resistors R23 and R24, respective ones of MOS field effect transistors MS21 to MS23 and MOS field effect transistors MS24 to MS27 are made conductive by programming the PROM transistors ME1 to ME7. The resistances of the resistors R23 and R24 are determined by the positions of the conductive MOS field effect transistors. The resistance controllable range is smaller than the first embodiment. However, same features and same advantages as the first embodiment are obtained.

Although some preferable embodiments are explained above, the resistances of the sub-resistors may be arbitrarily selective. It is apparent for the skilled in the art that any types of programmable read-only memories may be used to control the MOS transistors connected with sub-resistors. The sub-resistors may be made of diffused resistors or thin film resistors formed on a chip of semiconductor integrated circuit.

What is claimed is:
1. A reference voltage generator comprising first and second voltage terminals;
a differential amplifier having first and second input terminals and an output terminal from which a reference voltage is output;
a first resistor connected between said first voltage terminal and said first input terminal of said differential amplifier;

a second resistor connected between said first voltage terminal and said second input terminal of said differential amplifier;

a first transistor having a collector-emitter current path connected between said second voltage terminal and said first input terminal of said differential amplifier;

a first node;

a third resistor connected between said second input terminal of said differential amplifier and said first node;

a second transistor having a collector-emitter current path connected between said second voltage terminal and said first node;

a second node connected with the base of said first transistor and with the base of said second transistor;

a fourth resistor connected between said second node and said output terminal of said differential amplifier;

a series connection circuit coupled between said first voltage terminal and said second node and including a plurality of series-connected resistors; and means for programmably providing a by-pass current path for at least one of said series-connected resistors such that a currents flows through said series connection circuit via said by-pass current path and the remaining series-connected resistors which are not provided with said by-pass current path thereby to control an effective resistance value of said series connection circuit.

2. The reference voltage generator as claimed in claim 1, wherein said by-pass current path providing means comprises a plurality of field effect transistors and a plurality of non-volatile semiconductor memory elements, each of said field effect transistors having a source-drain current path connected in parallel to an associated one of said series-connected resistors, and each of said non-volatile semiconductor memory elements responding to programmed data therein and supplying to a gate of an associated one of said field effect transistors a voltage that turns the associated field effect transistor ON.

3. The reference voltage generator as claimed in claim 1, wherein said by-pass current path providing means comprises a plurality of field effect transistors and a plurality of non-volatile semiconductor memory elements, each of said field effect transistors having a source-drain current path connected between a different one of the connection points of said series-connected resistors and said second node, and each of said non-volatile semiconductor memory elements responding to programmed data therein and supplying to a gate of an associated one of said field effect transistors a voltage that turns the associated field effect transistor ON.

4. A reference volage generator comprising
first and second voltage lines;
a differential amplifier having an inverting input terminal;
a non-inverting input terminal and an output terminal from which a reference voltage is generated;
a first resistor connected between said first voltage line and said inverting input terminal;
a second resistor connected between said first voltage line and said non-inverting input terminal;

a first transistor having an emitter connected to said inverting input terminal, a collector connected to said second voltage line and a base;

a second transistor having an emitter, a collector connected to said second voltage line and a base connected to the base of said first transistor;

a third resistor connected between said non-inverting input terminal and the emitter of said second transistor;

a circuit node connected to the bases of said first and second transistors;

a fourth resistor connected between said output terminal and said circuit node;

a fifth resistor and a plurality of sixth resistors connected in series between said first voltage line and said circuit node;

a plurality of first field effect transistors each having a gate and a source-drain current path connected in parallel to each one of said plurality of sixth resistors; and a plurality of first non-volatile semiconductor memory elements each connected between one of said first and second voltage lines and the gate of the first associated first field effect transistor, at least one of said first non-volatile semiconductor memory elements being programmed to turn the associated first field effect transistor ON.

5. The reference voltage generator as claimed in claim 4, further comprising
a plurality of seventh resistors connected in series with said third resistor;
a plurality of second field effect transistors each having a gate and a source-drain path connected in parallel with an associated one of said seventh resistors; and
a plurality of second non-volatile semiconductor memory elements each connected between said one of said first and second voltage lines and the gate of the associated second field effect transistor, at least one of said second non-volatile semiconductor memory elements being programmed to turn the associated second field effect transistor ON.

6. The reference voltage generator as claimed in claim 5, further comprising means for connecting the gates of said first field effect transistors to the other of said first and second voltage lines and means for connecting the gates of said second field effect transistors to said other of said first and second voltage lines, each of said first and second non-volatile semiconductor memory elements having a control gate and a floating gate, the control gates of said first and second non-volatile semiconductor memories being connected to said other of said first and second voltage lines.

7. A reference voltage generator comprising
first and second voltage lines;
a differential amplifier having an inverting input terminal, a non-inverting input terminal and an output terminal from which a reference voltage is output;
a first resistor connected between said first voltage line and said inverting input terminal;
a second resistor connected between said first voltage line and said non-inverting input terminal;
a first transistor having an emitter connected to said inverting input terminal, a collector connected to said second voltage line and a base;

a second transistor having an emitter, a collector connected to said second voltage line and a base connected to the base of said first transistor;

a third resistor connected between said non-inverting input terminal and the emitter of said second transistor;

a circuit node connected with the base of said first transistor and with the base of said second transistor;

a fourth resistor connected between said output terminal and said circuit node;

a first plurality of field effect transistors each field effect transistor having a gate, a source and a drain, one of the sources and drains of said first field effect transistors being connected in common to said circuit node;

a fifth resistor and a plurality of sixth resistors connected in series between said first voltage line and the other of the source and drain of one field effect transistor of said plurality of field effect transistors, the others of the sources and drains of the remaining field effect transistors of said first plurality being connected to different ones of the connection points of said sixth resistors, respectively; and a plurality of first non-volatile semiconductor memory elements each connected between one of said first and second voltage lines and the gate of the associated first field effect transistor, at least one of said first non-volatile semiconductor memory elements being programmed to turn the associated first field effect transistor ON.

8. The reference voltage generator as claimed in claim 7, further comprising a plurality of seventh resistors connected in series with said third resistor;

a plurality of second field effect transistors each having a gate, a source and a drain, ones of the sources and drains of said second field effect transistors being connected to said non-inverting input terminal, the others of the sources and drains of said second field effect transistors being connected to different ones of connection points of said seventh resistors, respectively; and a plurality of second non-volatile semiconductor memory elements each connected between said one of said first and second voltage lines and the gate of the associated second field effect transistor, at least one of said second non-volatile semiconductor memory elements being programmed to turn the associated second field effect transistor ON.

9. The reference voltage generator as claimed in claim 8, further comprising means for connecting the gates of said first field effect transistors to the other of said first and second voltage lines and means for connecting the gates of said second field effect transistors to said other of said first and second voltage lines, each of said first and second non-volatile semiconductor memory elements having a control electrode and a floating gate, the control gates of said first and second non-volatile semiconductor memory elements being connected to said other of said first and second voltage lines.

* * * * *